(12) United States Patent
Kondou et al.

(10) Patent No.: US 10,451,444 B2
(45) Date of Patent: Oct. 22, 2019

(54) ENCODER HAVING FUNCTION OF ADJUSTING THRESHOLD VALUE OF COMPARATOR AND METHOD FOR CONTROLLING ENCODER

(71) Applicant: FANUC CORPORATION, Minamitsuru-gun, Yamanashi (JP)

(72) Inventors: Youhei Kondou, Yamanashi (JP); Keisuke Imai, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/002,398

(22) Filed: Jun. 7, 2018

(65) Prior Publication Data
US 2018/0356257 A1   Dec. 13, 2018

(30) Foreign Application Priority Data

Jun. 13, 2017 (JP) .................................. 2017-116108

(51) Int. Cl.
*G01D 5/244* (2006.01)
*H03K 5/24* (2006.01)
(Continued)

(52) U.S. Cl.
CPC .......... *G01D 5/24428* (2013.01); *G01D 5/14* (2013.01); *G01D 5/244* (2013.01); *G01D 5/245* (2013.01);
(Continued)

(58) Field of Classification Search
CPC .......... G01D 5/34; G01D 5/341; G01D 5/342; G01D 5/347; G01D 5/3473; G01D 5/36;
(Continued)

(56) References Cited

U.S. PATENT DOCUMENTS 4,498,040 A * 2/1985 Tatsushi ........... G01R 19/16571
257/E27.06
5,644,127 A 7/1997 Ohmae
(Continued)

FOREIGN PATENT DOCUMENTS

CN 101548158 A 9/2009
EP 3026446 A2 6/2016
(Continued)

*Primary Examiner* — John R Lee
(74) *Attorney, Agent, or Firm* — RatnerPrestia

(57) ABSTRACT

An encoder according to an embodiment of this disclosure includes a voltage generation circuit connected to a power supply through a diode and having a variable resistor, the voltage generation circuit outputting a voltage corresponding to a current flowing through the diode and a resistance value of the variable resistor, as a threshold value; a comparator for performing a comparison between an analog signal inputted from a detector for detecting rotation of a motor and the threshold value inputted from the voltage generation circuit, and outputting a comparison result as a comparator output; a resistance value variation circuit for varying the resistance value of the variable resistor; and a threshold value determination circuit for determining the threshold value based on a relationship between the resistance value and the comparator output.

6 Claims, 8 Drawing Sheets

(51) Int. Cl.
  *H03K 5/08* (2006.01)
  *G01D 5/14* (2006.01)
  *G01D 5/245* (2006.01)
  *G01D 5/36* (2006.01)
  *G01R 19/165* (2006.01)
  *G01D 5/347* (2006.01)

(52) U.S. Cl.
  CPC ............ *G01D 5/24476* (2013.01); *G01D 5/36* (2013.01); *G01R 19/165* (2013.01); *H03K 5/086* (2013.01); *H03K 5/24* (2013.01); *G01D 5/347* (2013.01); *G01D 5/34707* (2013.01)

(58) Field of Classification Search
  CPC ............ G01D 5/24428; G01D 5/24452; G01D 5/24457; G01D 5/24466; G01D 5/14; G01D 5/244; G01D 5/24476; G01D 5/245; G01D 5/34707; H03K 5/24; H03K 5/086; G01R 19/165; G01R 19/16566; G01R 19/30
  See application file for complete search history.

(56) References Cited

U.S. PATENT DOCUMENTS

| | | | |
|---|---|---|---|
| 5,893,049 A * | 4/1999 | Reggiardo | A61B 5/053 702/193 |
| 5,898,170 A | 4/1999 | Featherston et al. | |
| 6,518,910 B2 * | 2/2003 | Sakuragi | H03M 1/1225 341/118 |
| 8,054,093 B2 | 11/2011 | Yoshioka | |
| 2007/0278392 A1 * | 12/2007 | Toh | H03M 1/26 250/231.13 |
| 2012/0053433 A1 * | 3/2012 | Chamoun | A61B 5/0205 600/324 |
| 2014/0117212 A1 * | 5/2014 | Imai | H03F 3/087 250/208.2 |
| 2014/0217934 A1 * | 8/2014 | Suzuki | H02P 7/285 318/139 |
| 2016/0252375 A1 | 9/2016 | Kikuchi et al. | |
| 2018/0183228 A1 * | 6/2018 | Huber | G01R 19/165 |
| 2018/0356257 A1 * | 12/2018 | Kondou | G01D 5/24428 |
| 2018/0356260 A1 * | 12/2018 | Kondou | G01D 5/24476 |

FOREIGN PATENT DOCUMENTS

| | | |
|---|---|---|
| JP | H01282423 A | 11/1989 |
| JP | H07190810 A | 7/1995 |
| JP | H07191805 A | 7/1995 |
| JP | 2008076414 A | 4/2008 |
| JP | 2010-019676 A | 1/2010 |
| JP | 2016161343 A | 9/2016 |

* cited by examiner

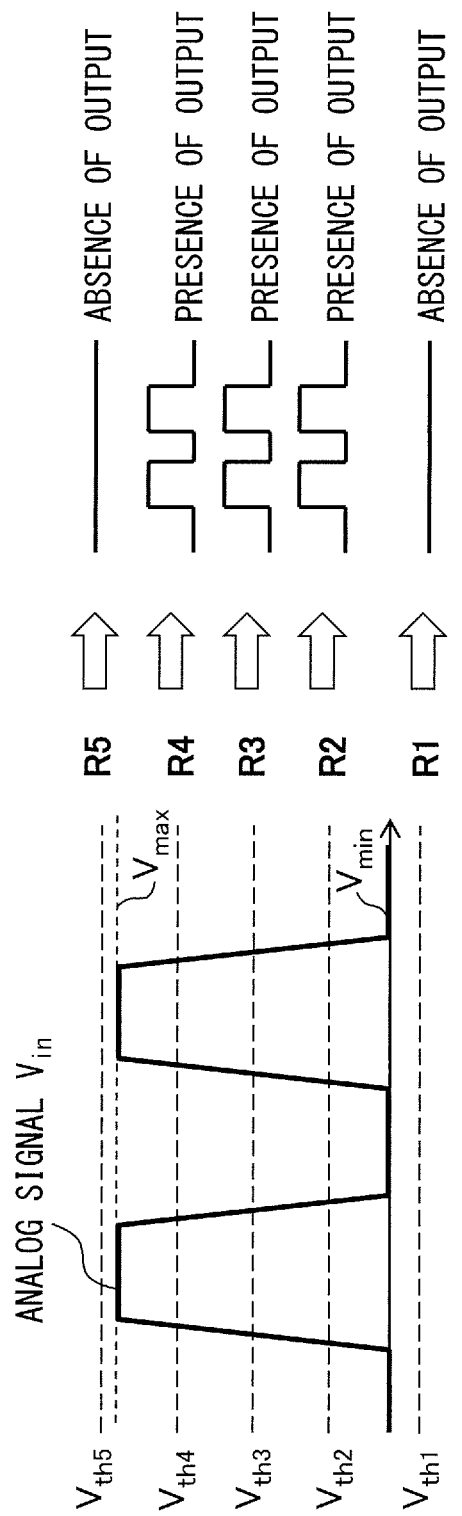

ENCODER HAVING FUNCTION OF ADJUSTING THRESHOLD VALUE OF COMPARATOR AND METHOD FOR CONTROLLING ENCODER This application is a new U.S. patent application that claims benefit of JP 2017-116108 filed on Jun. 13, 2017, the content of 2017-116108 is incorporated herein by reference.

BACKGROUND OF THE INVENTION

1. Field of the Invention

The present invention relates to an encoder having a function of adjusting a threshold value of a comparator used in the encoder and a method for controlling the encoder.

2. Description of Related Art

Encoders are used for detecting movement directions, movement amounts, or angles of rotating or moving objects. In the encoders, it is sometimes necessary to adjust the signals from the encoders in order to realize position detection with high accuracy. For example, a threshold value to be used for a comparison with an analog signal of the encoder is adjusted before shipping the product of the encoder. However, this increases tact time, and when the signal level varies with a lapse of time after shipment, it is difficult to readjust the threshold value. In other words, the analog signal adjustment before the shipment, by itself, cannot deal with a reduction in the amplitude of the analog signal outputted from a detection unit, due to aging deterioration of the encoder or the occurrence of an offset.

A comparator (comparator circuit) and an encoder that can convert a sinusoidal input signal into a rectangular wave with high accuracy without being affected by waviness of the input signal from a detection unit are known (for example, Japanese Unexamined Patent Publication (Kokai) No. 2010-019676). The conventional comparator includes an input unit to which the substantially sinusoidal input signal is inputted from the detector, a peak value calculation unit for calculating the peak value of the substantially sinusoidal input signal inputted to the input unit, a bottom value calculation unit for calculating the bottom value of the substantially sinusoidal input signal inputted to the input unit, a threshold value calculation unit for calculating a threshold value in a range between the peak value calculated by the peak value calculation unit and the bottom value calculated by the bottom value calculation unit, and a threshold value setting unit for setting the threshold value to convert the substantially sinusoidal input signal into a rectangular wave signal.

SUMMARY OF THE INVENTION

Conventional encoders have a problem that, when the level of the analog signal from the detection unit varies with a lapse of time after shipment, it is difficult to readjust the threshold value to be used in the comparator for a comparison with the analog signal from the detection unit to an optimal value.

An encoder according to an embodiment of this disclosure includes a voltage generation circuit connected to a power supply through a diode and having a variable resistor, the voltage generation circuit outputting a voltage corresponding to a current flowing through the diode and a resistance value of the variable resistor, as a threshold value; a comparator configured to perform a comparison between an analog signal inputted from a detector for detecting rotation of a motor and the threshold value inputted from the voltage generation circuit, and output a comparison result as a comparator output; a resistance value variation circuit configured to vary the resistance value of the variable resistor; and a threshold value determination circuit configured to determine the threshold value based on relationship between the resistance value and the comparator output.

An encoder according to another embodiment of this disclosure includes a voltage generation circuit connected to a power supply through a diode and having a variable resistor, the voltage generation circuit outputting a voltage corresponding to a current flowing through the diode and a resistance value of the variable resistor, as a threshold value; multiple comparators configured to perform comparisons between each of multiple analog signals inputted from multiple detectors configured to detect rotation of multiple motors and the threshold value inputted from the voltage generation circuit, and output comparison results as multiple comparator outputs; a resistance value variation circuit configured to vary the resistance value of the variable resistor; and a threshold value determination circuit configured to determine the threshold value based on relationship between the resistance value and the multiple comparator outputs.

A method for controlling an encoder according to an embodiment of this disclosure includes inputting an output voltage of a voltage generation circuit having a variable resistor to a comparator, as a threshold value; inputting an analog signal from a detector of the encoder to the comparator; varying a resistance value of the variable resistor by a resistance value variation circuit; performing a comparison between the analog signal and the threshold value, and outputting a comparison result to a threshold value determination circuit, as a comparator output by the comparator; determining the threshold value based on relationship between the resistance value and the comparator output by the threshold value determination circuit; and varying the resistance value of the variable resistor of the voltage generation circuit by the resistance value variation circuit, such that the determined threshold value is inputted from the voltage generation circuit to the comparator.

A method for controlling an encoder according to another embodiment of this disclosure includes inputting an output voltage of a voltage generation circuit having a variable resistor to multiple comparators, as a threshold value; inputting multiple analog signals from multiple detectors of the encoder to the multiple comparators; varying a resistance value of the variable resistor by a resistance value variation circuit; performing comparisons between each of the multiple analog signals and the threshold value, and outputting comparison results to a threshold value determination circuit, as multiple comparator outputs by the multiple comparators; determining the threshold value based on relationship between the resistance value and the multiple comparator outputs by the threshold value determination circuit; and varying the resistance value of the variable resistor of the voltage generation circuit by the resistance value variation circuit, such that the determined threshold value is inputted from the voltage generation circuit to the multiple comparators.

BRIEF DESCRIPTION OF THE DRAWINGS

The objects, features, and advantages of the present invention will be more apparent from the following description of preferred embodiments relating to the accompanying drawings. In the drawings.

FIG. 4 is a drawing showing the relationship between resistance and comparator output when a resistance value of a variable resistor of a voltage generation circuit is varied;

DETAILED DESCRIPTION OF THE INVENTION

An encoder and a method for controlling the encoder according to the present invention will be described below with reference to the drawings. However, the technical scope of the present invention is not limited to the embodiments but encompasses the inventions described in claims and equivalents thereof.

Figure 1:
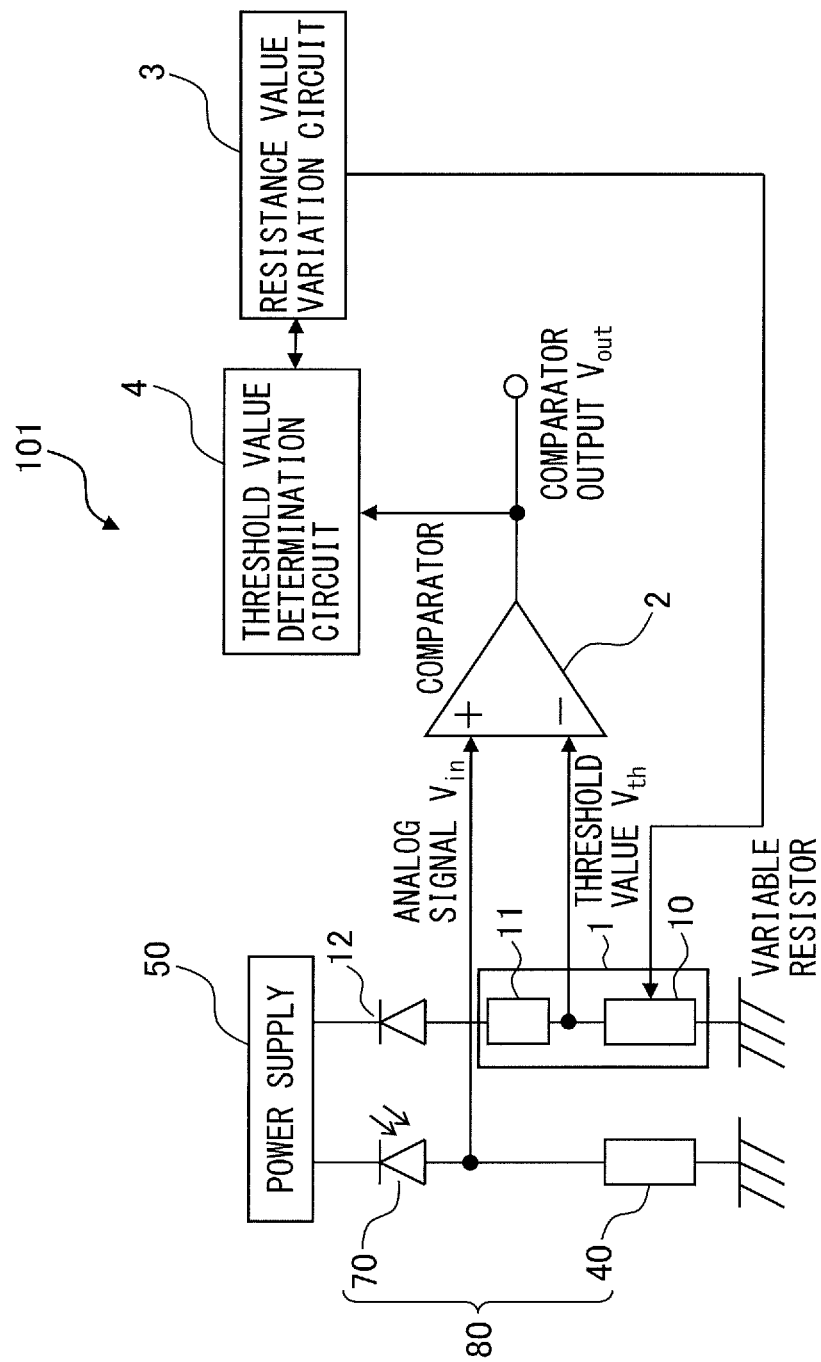
FIG. 1 is a block diagram of an encoder according to a first embodiment.

An encoder according to a first embodiment will be described. FIG. 1 is a block diagram of the encoder according to the first embodiment. An encoder 101 according to the first embodiment includes a voltage generation circuit 1, a comparator 2, a resistance value variation circuit 3, and a threshold value determination circuit 4.

This embodiment uses an optical encoder, but may use a magnetic encoder instead. A detector 80 to detect the rotation of a motor includes a light receiving element 70 and a resistor 40. The light receiving element 70 receives light from a light-emitting diode, etc., through a slit disc provided on an axis of the motor, etc., and outputs an analog signal. As the light receiving element 70, a photodiode, etc., is used. Two signals, i.e., an A-phase signal and a B-phase signal, are used in general, but this embodiment describes only one phase signal of the A-phase and B-phase signals. An analog signal $V_{in}$ detected by the detector 80 is inputted to a noninverting input terminal ("+") of the comparator 2.

The voltage generation circuit 1 is connected to a power supply 50 through a diode 12. The voltage generation circuit 1 has a variable resistor 10 and a resistor 11. The voltage generation circuit 1 outputs a voltage corresponding to a current flowing through the diode 12 and a resistance value of the variable resistor 10, as a threshold voltage (hereinafter also referred to as "threshold value").

When "I" represents a current flowing through the diode 12, and "R" represents a resistance value of the variable resistor 10, the threshold voltage $V_{th}$ is calculated by the following equation.

$$V_{th} = I \times R$$

Therefore, varying the resistance value R of the variable resistor 10 enables adjustment of the threshold voltage $V_{th}$. The threshold value $V_{th}$ outputted from the voltage generation circuit 1 is inputted to an inverting input terminal ("−") of the comparator 2.

Figure 2A:
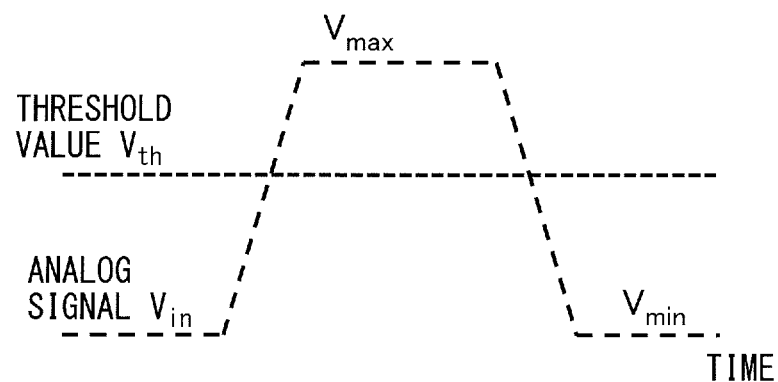
FIG. 2A is a timing chart of an analog signal inputted from a detector of the encoder to a comparator and a threshold value.
Figure 2B:
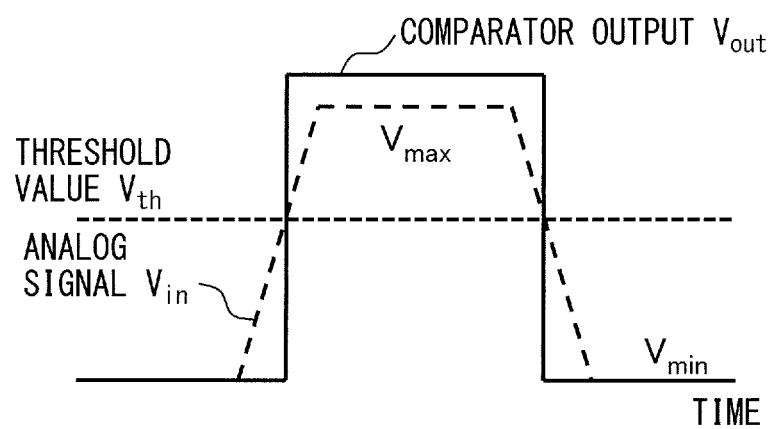
FIG. 2B is a timing chart of the analog signal inputted from the detector of the encoder to the comparator and a comparator output.

The comparator 2 performs a comparison between the analog signal $V_{in}$ inputted from the detector 80 to detect the rotation of the motor and the threshold value $V_{th}$ inputted from the voltage generation circuit 1, and outputs a comparison result to the threshold value determination circuit 4, as a comparator output $V_{out}$. The relationship between the analog signal $V_{in}$, the threshold value $V_{th}$, and the comparator output $V_{out}$ will be described. FIG. 2A is a timing chart of the analog signal $V_{in}$ inputted from the detector 80 of the encoder to the comparator 2 and the threshold value $V_{th}$. FIG. 2B is a timing chart of the analog signal $V_{in}$ inputted from the detector 80 of the encoder to the comparator 2 and the comparator output $V_{out}$. The comparator 2 performs a comparison between the analog signal $V_{in}$ and the threshold value $V_{th}$. When the analog signal $V_{in}$ is lower than the threshold value $V_{th}$, the comparator 2 outputs a low level signal (Low) as the comparator output $V_{out}$. On the other hand, when the analog signal $V_{in}$ is equal to or higher than the threshold value $V_{th}$, the comparator 2 outputs a high level signal (High) as the comparator output $V_{out}$. In a normal state, when the analog signal $V_{in}$ of a certain waveform is inputted, the comparator output $V_{out}$ has a rectangular waveform. On the other hand, in an abnormal state, even if the analog signal $V_{in}$ has a certain waveform, the comparator output $V_{out}$ stays at a low level or a high level. As is apparent from FIG. 2B, in order to obtain a normal comparator output $V_{out}$, the threshold value $V_{th}$ is set in a range between a minimum value $V_{min}$ and a maximum value $V_{max}$ of the analog signal $V_{in}$.

Figure 3A:
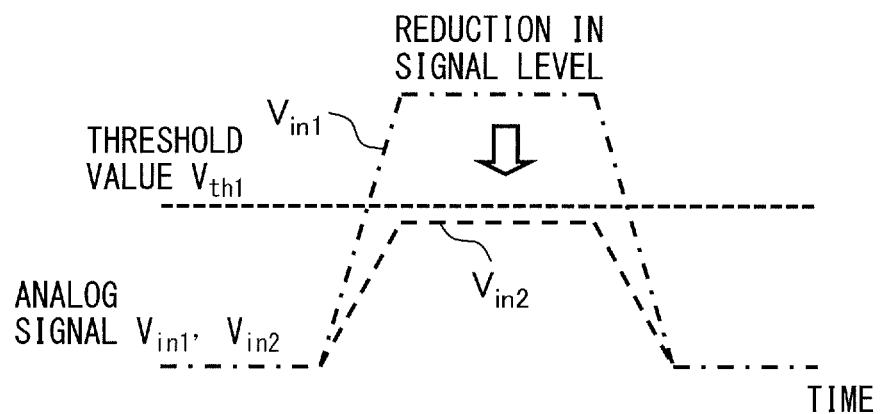
FIG. 3A is a timing chart of an analog signal inputted from the detector of the encoder to the comparator before and after a reduction in signal level.
Figure 3B:
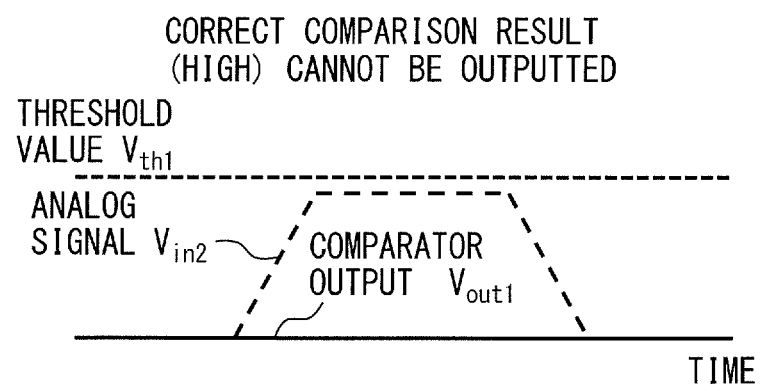
FIG. 3B is a timing chart of a comparator output when the level of the analog signal inputted from the detector of the encoder to the comparator is lowered to less than a threshold value.

An example of an abnormal comparator output $V_{out}$ will be described. FIG. 3A is a timing chart of an analog signal $V_{in}$ inputted from the detector 80 of the encoder to the comparator 2 before and after a reduction in signal level. FIG. 3B is a timing chart of a comparator output $V_{out}$ when the level of the analog signal $V_{in}$ inputted from the detector 80 of the encoder to the comparator 2 is lowered to less than a threshold value. As shown in FIG. 3A, an initial (before a reduction in signal level) analog signal is indicated as $V_{in1}$, and an analog signal after aging deterioration (after the reduction in signal level) is indicated as $V_{in2}$. Furthermore, the initial analog signal $V_{in1}$ is higher than an initial threshold value $V_{th1}$, while the analog signal $V_{in2}$ after aging deterioration is lower than the initial threshold value $V_{th1}$. In this case, as shown in FIG. 3B, after aging deterioration, the comparator output $V_{out}$ stays at a low level, in contrast to the waveform of the analog signal $V_{in2}$ after aging deterioration. As a result, the comparator 2 cannot output a correct comparison result (High). The encoder according to this embodiment aims at solving this problem, and enables obtaining a correct comparator output, even when an analog signal varies owing to aging deterioration, etc.

The resistance value variation circuit 3 varies a resistance value of the variable resistor 10. The resistance value variation circuit 3 may vary the resistance value of the variable resistor 10 continuously or at regular intervals. However, the method for varying the resistance value of the variable resistor 10 is not limited to this example. Information regarding the resistance value varied by the resistance value variation circuit 3 is outputted to the threshold value determination circuit 4.

The threshold value determination circuit 4 determines a threshold value based on the relationship between resistance value and comparator output. The threshold value may be the average value of the maximum value and the minimum value of the threshold values with which, when the resistance value is varied continuously, the comparator output becomes normal.

FIG. 4 is a drawing showing the relationship between resistance and comparator output when the resistance value of the variable resistor 10 of the voltage generation circuit 1 is varied. When the resistance value of the variable resistor 10 of the voltage generation circuit 1 is varied from R1 to R5, the voltage generation circuit 1 outputs threshold values of $V_{th1}$ to $V_{th5}$. When the resistance value is R1, the threshold value $V_{th1}$ is lower than a minimum value $V_{min}$ of an analog signal $V_{in}$. When the resistance value is R5, the threshold value $V_{th5}$ is higher than a maximum value $V_{max}$ of the analog signal $V_{in}$. Therefore, the comparator output does not have a rectangular waveform (absence of output). In other words, the comparator output becomes abnormal in this case.

When the resistance value is R2 to R4, since the threshold values $V_{th2}$ to $V_{th4}$ are in a range between the maximum value $V_{max}$ and the minimum value $V_{min}$ of the analog signal $V_{in}$, the comparator output has a rectangular waveform (presence of output). In other words, the comparator output becomes normal in this case. A threshold value to be inputted to the comparator 2 to make a comparison with the analog signal may be set at the average value of a maximum value $V_{th4}$ and a minimum value $V_{th2}$ of the threshold values with which, when the resistance value is varied continuously from R1 to R5, the comparator output becomes normal.

Alternatively, the threshold value may be set at the average value of the maximum value $V_{th4}$, the intermediate value $V_{th3}$, and the minimum value $V_{th2}$ of the threshold values with which, when the resistance value is varied at regular intervals from R1 to R5, the comparator output becomes normal.

Figure 5A:
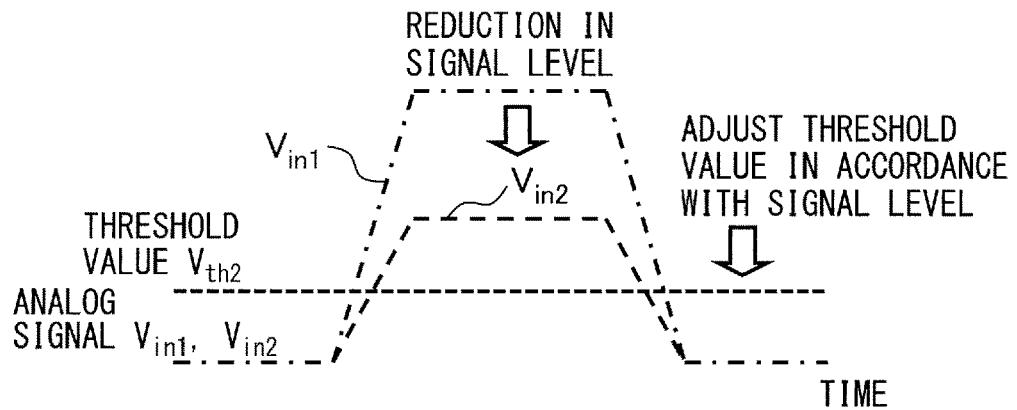
FIG. 5A is a drawing for explaining adjustment of a threshold value when the level of an analog signal inputted from the detector of the encoder to the comparator is lowered.
Figure 5B:
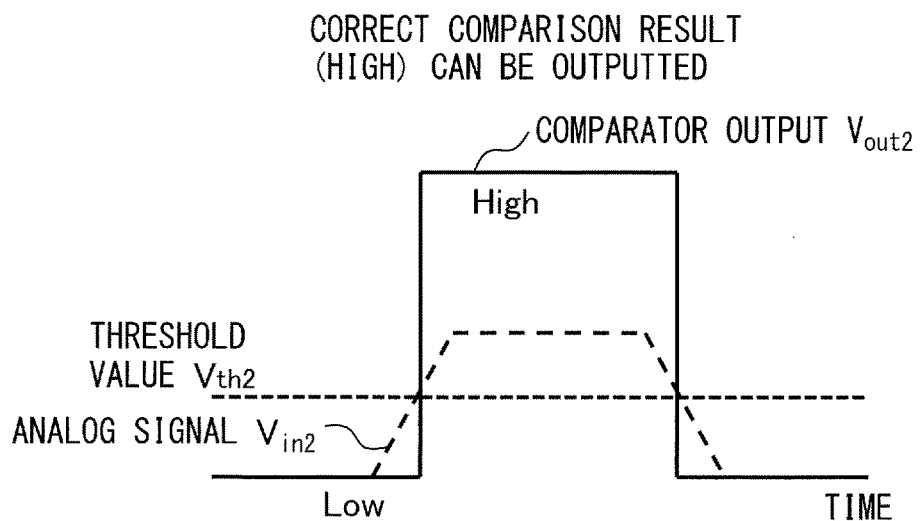
FIG. 5B is a timing chart of a comparator output after the adjustment of the threshold value when the level of the analog signal inputted from the detector of the encoder to the comparator is lowered.

The resistance value variation circuit 3 varies the resistance value of the variable resistor 10 such that the determined threshold value is inputted from the voltage generation circuit 1 to the comparator 2. FIG. 5A is a drawing for explaining adjustment of a threshold value when the level of an analog signal inputted from the detector 80 of the encoder to the comparator 2 is lowered. FIG. 5B is a timing chart of a comparator output $V_{out2}$ after the adjustment of the threshold value when the level of the analog signal inputted from the detector 80 of the encoder to the comparator 2 is lowered. For example, as is described with reference to FIG. 3A, the initial analog signal $V_{in1}$ is assumed to be reduced to the analog signal $V_{in2}$, due to aging deterioration, etc. In this case, if the analog signal $V_{in2}$ after aging deterioration is lower than the initial threshold value $V_{th1}$, a correct comparator output cannot be obtained, as described above. Thus, as shown in FIG. 5A, the threshold value determination circuit 4 and the resistance value variation circuit 3 adjust the threshold value in accordance with the analog signal $V_{in2}$ after aging deterioration. For example, the average value of the maximum value and the minimum value of the threshold values with which, when the resistance value is varied continuously, the comparator output becomes normal may be set as a new threshold value $V_{th2}$. The comparator 2 performs a comparison between the analog signal $V_{in2}$ after aging deterioration and the new threshold value $V_{th2}$, and hence, as shown in FIG. 5B, obtains a normal comparator output $V_{out2}$ of a rectangular waveform.

Figure 6:
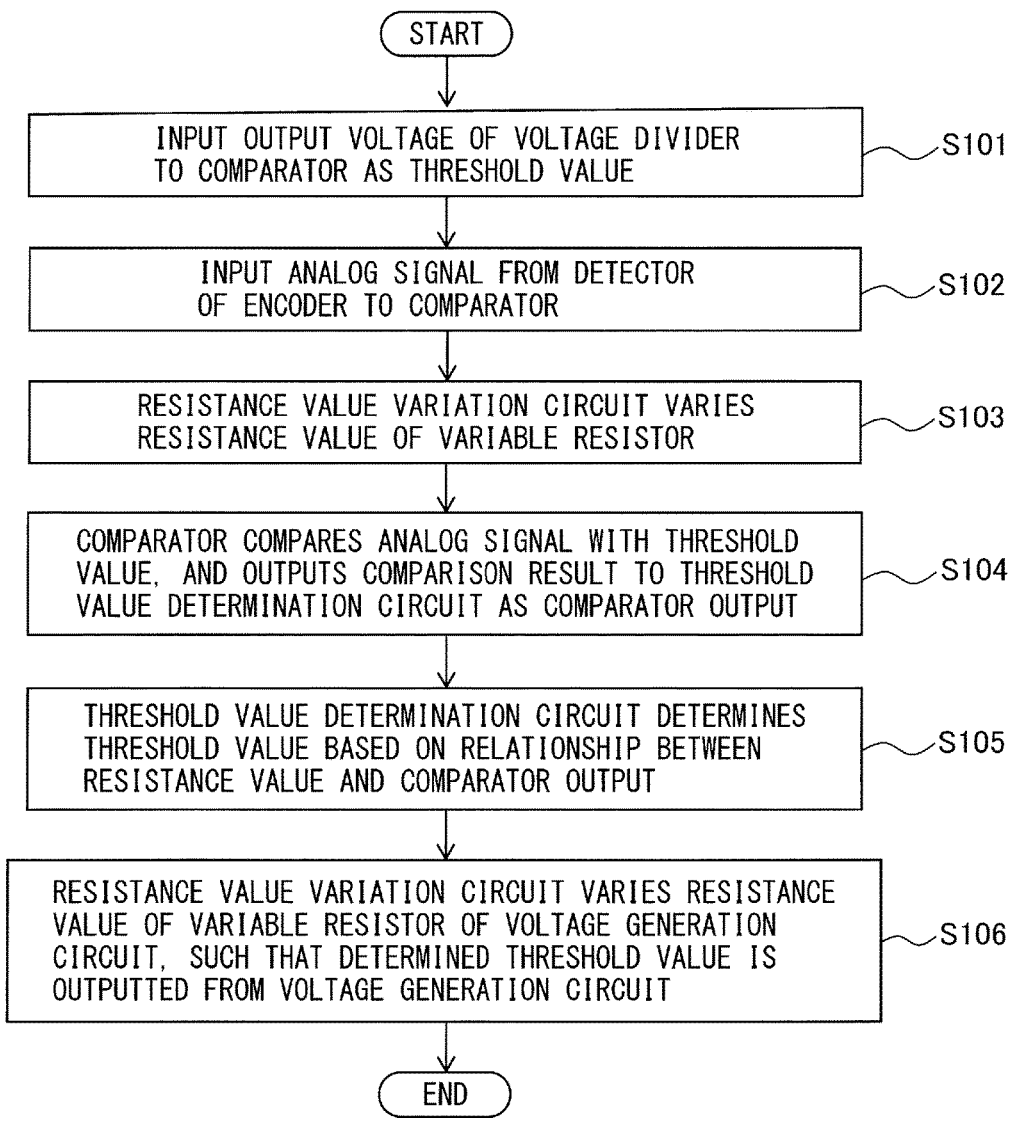
FIG. 6 is a flowchart of the operation of the encoder according to the first embodiment.

Next, a method for controlling the encoder according to the first embodiment will be described. FIG. 6 is a flowchart of the operation of the encoder according to the first embodiment. In step S101, an output voltage of the voltage generation circuit 1 (e.g., voltage divider) is inputted to the comparator 2 as the threshold value $V_{th}$. The threshold value $V_{th}$ is a voltage corresponding to the current flowing through the diode 12 connected to the voltage generation circuit 1 and the resistance value of the variable resistor 10. The resistance value R of the variable resistor 10 to obtain the desired threshold value $V_{th}$ is calculated by the following equation using the current I flowing through the diode 12.

$$R=V_{th}/I$$

Next, in step S102, the analog signal $V_{in}$ is inputted from the detector 80 of the encoder to the comparator 2.

Next, in step S103, the resistance value variation circuit 3 varies the resistance value of the variable resistor 10. The resistance value variation circuit 3 may vary the resistance value of the variable resistor 10 continuously or at regular intervals however, the method for varying the resistance value of the variable resistor 10 is not limited to this example. Information regarding the resistance value varied by the resistance value variation circuit 3 is outputted to the threshold value determination circuit 4.

Next, in step S104, the comparator 2 makes a comparison between the analog signal $V_{in}$ and the threshold value $V_{th}$, and outputs the comparison result to the threshold value determination circuit 4 as comparator output $V_{out}$.

Next, in step S105, the threshold value determination circuit 4 determines the threshold value based on the relationship between the resistance value and the comparator output. The threshold value may be the average value of the maximum value and the minimum value of the threshold values with which, when the resistance value is varied continuously, the comparator output becomes normal. Alternatively, the threshold value may be the average value of the maximum value, the intermediate value, and the minimum value of the threshold values with which, when the resistance value is varied at regular intervals, the comparator output becomes normal. However, the present invention is not limited to this example. The threshold value determination circuit 4 may calculate a threshold value by another calculation method based on the relationship between resistance value and comparator output.

Next, in step S106, the resistance value variation circuit 3 varies the resistance value of the variable resistor 10 of the voltage generation circuit 1, such that the determined threshold value is inputted from the voltage generation circuit 1 to the comparator 2.

As described above, since the encoder according to the first embodiment adjusts the threshold value to be used for a comparison with the analog signal inputted to the comparator, the normal comparator output can be obtained, even if the analog signal from the detector of the encoder varies, owing to aging deterioration, etc.

Figure 7:
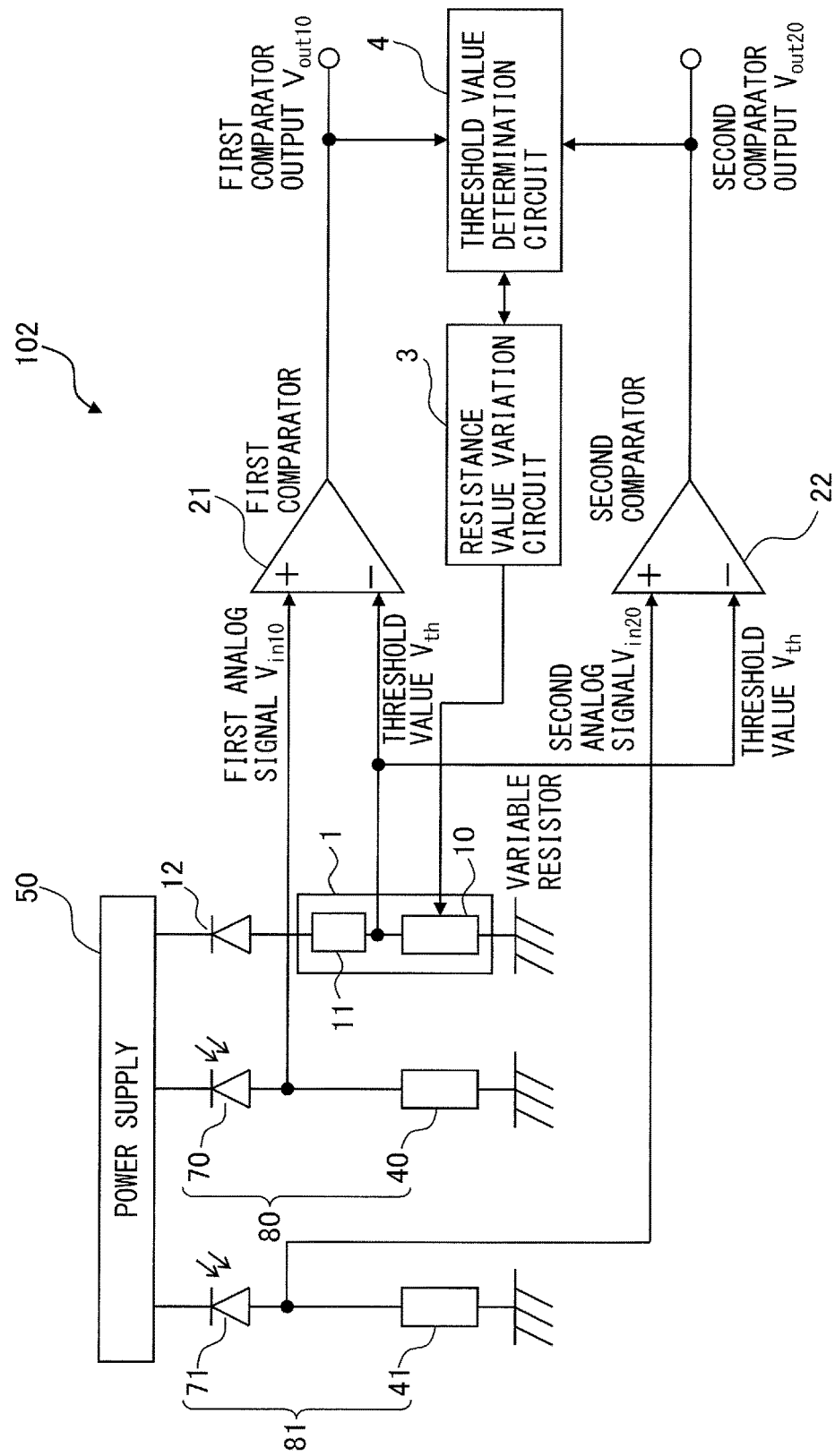
FIG. 7 is a block diagram of an encoder according to a second embodiment.
Figure 8:
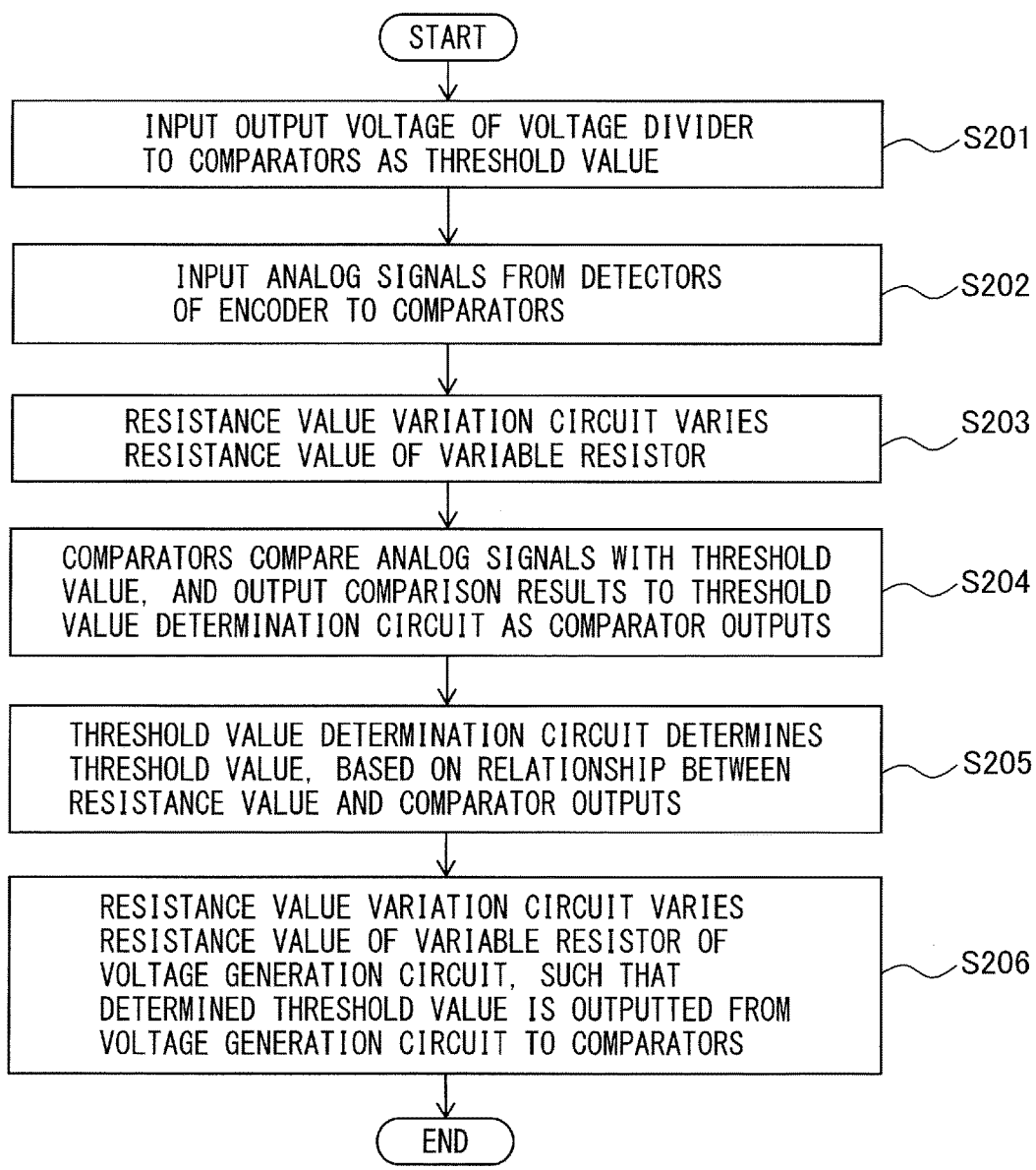
FIG. 8 is a flowchart of the operation of the encoder according to the second embodiment.

Next, an encoder according to a second embodiment will be described. FIG. 7 is a block diagram of the encoder according to the second embodiment. An encoder 102 according to the second embodiment includes a voltage generation circuit 1, a plurality of comparators (21 and 22), a resistance value variation circuit 3, and a threshold value determination circuit 4. Among the components of the encoder 102 according to the second embodiment, the components which are the same as the components of the encoder 101 according to the first embodiment are indicated by the same reference numerals. The difference between the encoder 102 according to the second embodiment and the encoder 101 according to the first embodiment is that multiple detectors are provided to detect the rotation, etc., of motors, and multiple comparators compare the multiple analog signals outputted from the multiple detectors with a single common threshold value.

The voltage generation circuit 1 outputs a voltage corresponding to the current flowing through the diode 12 and the resistance value of the variable resistor 10 to the inverting input terminal ("−") of each of the first comparator 21 and the second comparator 22 as a threshold value $V_{th}$. The two comparators are used as examples of the multiple comparators, but the number of comparators may be three or more in accordance with the number of detectors.

The multiple comparators, e.g., the first comparator 21 and the second comparator 22, make comparisons between each of multiple analog signals (a first analog signal $V_{in10}$ and a second analog signal $V_{in20}$) inputted from multiple detectors (a first detector 80 and a second detector 81) configured to detect the rotation of motors and the threshold value $V_{th}$ inputted from the voltage generation circuit 1, and output comparison results to the threshold value determination circuit 4 as multiple comparator outputs (a first comparator output $V_{out10}$ and a second comparator output $V_{out20}$). The second detector 81 has a light receiving element 71 that receives light from a light-emitting diode, etc., through a slit disc provided on an axis of a motor, etc., and outputs an analog signal, and a resistor 41.

The resistance value variation circuit 3 varies the resistance value of the variable resistor 10. The resistance value variation circuit 3 may vary the resistance value of the variable resistor 10 continuously or at regular intervals. However, the method for varying the resistance value of the variable resistor 10 is not limited to this example. Information regarding the resistance value varied by the resistance value variation circuit 3 is outputted to the threshold value determination circuit 4.

The threshold value determination circuit 4 determines the threshold value based on the relationship between the resistance value and the multiple comparator outputs. The threshold value may be set at the minimum value of the multiple threshold values, corresponding to the multiple analog signals, each of which is calculated from the maximum value and the minimum value of the threshold values with which, when the resistance value is varied continuously, the comparator output becomes normal. For example, $V_{th1}$ represents the threshold value corresponding to the first analog signal $V_{in1}$ calculated from the maximum value and the minimum value of the threshold values with which, when the resistance value is varied continuously, the first comparator output $V_{out10}$ of the first comparator 21 becomes normal, and $V_{th2}$ represents the threshold value corresponding to the second analog signal $V_{in2}$ calculated from the maximum value and the minimum value of the threshold values with which, when the resistance value is varied continuously, the second comparator output $V_{out20}$ of the second comparator 22 becomes normal. The minimum value of $V_{th1}$ and $V_{th2}$ is set as a new threshold value. By determining the new threshold value in this manner, the comparator output becomes normal for every analog signal to be inputted to each of the multiple comparators. Alternatively, the threshold value may be set at the minimum value of the multiple threshold values, corresponding to the multiple analog signals, each of which is calculated from the maximum value, the intermediate value, and the minimum value of the threshold values with which, when the resistance value is varied at regular intervals, the comparator output becomes normal.

The resistance value variation circuit 3 varies the resistance value of the variable resistor 10, such that the determined threshold value is inputted from the voltage generation circuit 1 to the comparators (21 and 22).

Next, a method for controlling the encoder according to the first embodiment will be described. FIG. 6 is a flowchart of the operation of the encoder according to the first embodiment. In step S101, an output voltage of the voltage generation circuit 1 (e.g., voltage divider) is inputted to the comparator 2 as the threshold value $V_{th}$. The threshold value $V_{th}$ is a voltage corresponding to the current flowing through the diode 12 connected to the voltage generation circuit 1 and the resistance value of the variable resistor 10. The resistance value R of the variable resistor 10 to obtain the desired threshold value $V_{th}$ is calculated by the following equation using the current I flowing through the diode 12.

Next, in step S202, analog signals ($V_{in10}$ and $V_{in20}$) are inputted from the detectors (80 and 81) of the encoder to the comparators (21 and 22), respectively.

Next, in step S203, the resistance value variation circuit 3 varies the resistance value of the variable resistor 10. The resistance value variation circuit 3 may vary the resistance value of the variable resistor 10 continuously or at regular intervals. However, the method for varying the resistance value of the variable resistor 10 is not limited to this example. Information regarding the resistance value varied by the resistance value variation circuit 3 is outputted to the threshold value determination circuit 4.

Next, in step S204, the comparators (21 and 22) perform comparisons between each of the analog signals ($V_{in10}$ and $V_{in20}$) and the threshold value $V_{th}$, and output the comparison results to the threshold value determination circuit 4 as comparator outputs (a first comparator output $V_{out10}$ and a second comparator output $V_{out20}$) respectively.

Next, in step S205, the threshold value determination circuit 4 determines the threshold value based on the relationship between resistance value and multiple comparator outputs. The threshold value may be set at the minimum value of multiple threshold values, corresponding to the multiple analog signals, each of which is calculated from the maximum value and the minimum value of the threshold values with which, when the resistance value is varied continuously, the comparator output becomes normal. Alternatively, the threshold value may be set at the minimum value of the multiple threshold values, corresponding to the multiple analog signals, each of which is calculated from the maximum value, the intermediate value, and the minimum value of the threshold values with which, when the resistance value is varied at regular intervals, the comparator output becomes normal. However, the present invention is not limited to the example, and the threshold value determination circuit 4 may calculate the threshold value by another calculation method based on the relationship between resistance value and multiple comparator outputs.

Next, in step S206, the resistance value variation circuit 3 varies the resistance value of the variable resistor 10 of the voltage generation circuit 1, such that the determined threshold value is inputted from the voltage generation circuit 1 to the comparators (21 and 22).

As described above, in the encoder according to the second embodiment, even if at least one of the multiple analog signals from the detectors of the encoder varies due to aging deterioration, etc., the threshold value to be used for comparisons with the analog signals inputted to the comparators is adjusted, thus enabling obtaining multiple normal comparator outputs.

In the encoders according to the embodiments and the methods for controlling the encoders, since the threshold value to be used in the comparator for a comparison with the analog signal of the encoder can be automatically adjusted, an adjustment step before shipment is no longer needed, thus allowing for a reduction in the tact time of the product. Even if the level of the analog signal varies due to aging deterioration after shipment, the threshold value can be automatically readjusted to an optimal value.

In the encoders according to the embodiments of this disclosure and the methods for controlling the encoders, even if the level of the analog signal from the detector varies due to aging deterioration after shipment, it is possible to readjust the threshold value to be used in the comparator for a comparison with the analog signal from the detector to an optimal value.

What is claimed is:

1. An encoder comprising:
a voltage generation circuit connected to a power supply through a diode and having a variable resistor, the voltage generation circuit outputting a voltage (I×R) corresponding to a current I flowing through the diode and a resistance value R of the variable resistor, as a threshold value $V_{th}$;
a comparator configured to perform a comparison between an analog signal inputted from a detector for detecting rotation of a motor and the threshold value $V_{th}$ inputted from the voltage generation circuit, and output a comparison result as a comparator output $V_{out}$;
a resistance value variation circuit configured to vary the resistance value R of the variable resistor; and
a threshold value determination circuit configured to determine the threshold value $V_{th}$ based on a relationship between the resistance value R and the comparator output $V_{out}$,
wherein the threshold value $V_{th}$ is an average value of a maximum value and a minimum value of threshold values with which, when the resistance value R is varied continuously, the comparator output $V_{out}$ becomes normal.

2. An encoder comprising:
a voltage generation circuit connected to a power supply through a diode and having a variable resistor, the voltage generation circuit outputting a voltage (I×R) corresponding to a current I flowing through the diode and a resistance value R of the variable resistor, as a threshold value $V_{th}$;
multiple comparators configured to perform comparisons between each of multiple analog signals inputted from multiple detectors for detecting rotation of multiple motors and the threshold value $V_{th}$ inputted from the voltage generation circuit, and output comparison results as multiple comparator outputs $V_{out}$;
a resistance value variation circuit configured to vary the resistance value R of the variable resistor; and
a threshold value determination circuit configured to determine the threshold value $V_{th}$ based on a relationship between the resistance value R and the multiple comparator outputs $V_{out}$,
wherein the threshold value $V_{th}$ is a minimum value of multiple threshold values, corresponding to the multiple analog signals, each of which is calculated from a maximum value and a minimum value of threshold values with which, when the resistance value R is varied continuously, the comparator output $V_{out}$ becomes normal.

3. The encoder according to claim 1, wherein the threshold value determination circuit determines the threshold value $V_{th}$ by operating the resistance value variation circuit at a predetermined constant timing.

4. A method for controlling an encoder comprising:
inputting an output voltage of a voltage generation circuit to a comparator, wherein the voltage generation circuit having a variable resistor is connected to a power supply through a diode and outputs the output voltage (I×R) corresponding to a current I flowing through the diode and a resistance value R of the variable resistor, as a threshold value $V_{th}$;
inputting an analog signal from a detector of the encoder to the comparator;
varying a resistance value R of the variable resistor by a resistance value variation circuit;
performing a comparison between the analog signal and the threshold value $V_{th}$, and outputting a comparison result to a threshold value determination circuit as a comparator output $V_{out}$ by the comparator;
determining the threshold value $V_{th}$ based on a relationship between the resistance value R and the comparator output $V_{out}$ by the threshold value determination circuit; and
varying the resistance value R of the variable resistor of the voltage generation circuit by the resistance value variation circuit, such that the determined threshold value $V_{th}$ is inputted from the voltage generation circuit to the comparator,
wherein the threshold value $V_{th}$ is an average value of a maximum value and a minimum value of threshold values with which, when the resistance value R is varied continuously, the comparator output $V_{out}$ becomes normal.

5. A method for controlling an encoder comprising:
inputting an output voltage of a voltage generation circuit to multiple comparators, wherein the voltage generation circuit having a variable resistor is connected to a power supply through a diode and outputs the output voltage (I×R) corresponding to a current I flowing through the diode and a resistance value R of the variable resistor, as a threshold value $V_{th}$;
inputting multiple analog signals from multiple detectors of the encoder to the multiple comparators;
varying a resistance value R of the variable resistor by a resistance value variation circuit;
performing comparisons between each of the multiple analog signals and the threshold value $V_{th}$, and outputting comparison results to a threshold value determination circuit, as multiple comparator outputs $V_{out}$ by the multiple comparators;
determining the threshold value $V_{th}$ based on relationship between the resistance value R and the multiple comparator outputs $V_{out}$ by the threshold value determination circuit; and
varying the resistance value R of the variable resistor of the voltage generation circuit by the resistance value variation circuit, such that the determined threshold value $V_{th}$ is inputted from the voltage generation circuit to the multiple comparators,
wherein the threshold value $V_{th}$ is a minimum value of multiple threshold values, corresponding to the multiple analog signals, each of which is calculated from a maximum value and a minimum value of threshold values with which, when the resistance value R is varied continuously, the comparator output $V_{out}$ becomes normal.

6. The method according to claim 4, wherein the threshold value determination circuit determines the threshold value $V_{th}$ by operating the resistance value variation circuit at a predetermined constant timing.

* * * * *